(12) United States Patent
Zimmerman et al.

(10) Patent No.: US 9,978,707 B1
(45) Date of Patent: May 22, 2018

(54) ELECTRICAL-DEVICE ADHESIVE BARRIER

(71) Applicant: Delphi Technologies, Inc., Troy, MI (US)

(72) Inventors: David W. Zimmerman, Noblesville, IN (US); Michael J. Pepples, Noblesville, IN (US); David W. Ihms, Russiaville, IN (US)

(73) Assignee: DELPHI TECHNOLOGIES, INC., Troy, MI (US)

( * ) Notice: Subject to any disclaimer, the term of this patent is extended or adjusted under 35 U.S.C. 154(b) by 0 days. days.

(21) Appl. No.: 15/467,659

(22) Filed: Mar. 23, 2017

(51) Int. Cl.
*H01L 23/48* (2006.01)
*H01L 23/52* (2006.01)
(Continued)

(52) U.S. Cl.
CPC .......... *H01L 24/17* (2013.01); *H01L 23/3121* (2013.01); *H01L 23/3142* (2013.01); *H01L 23/49838* (2013.01); *H01L 23/66* (2013.01); *H01L 24/06* (2013.01); *H01L 24/32* (2013.01); *H01L 24/73* (2013.01); *H01L 2223/6605* (2013.01); *H01L 2223/6683* (2013.01); *H01L 2224/16227* (2013.01); *H01L 2224/30179* (2013.01); *H01L 2224/32227* (2013.01);
(Continued)

(58) Field of Classification Search
CPC . H01L 2224/26145; H01L 2924/18161; H01L 2924/15331; H01L 2224/26175; H01L 2224/97
USPC .................. 257/778, 780, 781, 782
See application file for complete search history.

(56) References Cited

U.S. PATENT DOCUMENTS 6,528,894 B1* 3/2003 Akram ................ H01L 23/3171
257/778
6,774,497 B1* 8/2004 Qi .......................... H01L 21/563
257/778
(Continued)

FOREIGN PATENT DOCUMENTS

JP 2006140327 A 6/2006

*Primary Examiner* — S. V. Clark
(74) *Attorney, Agent, or Firm* — Lawrence D. Hazelton

(57) ABSTRACT

A circuit-board-assembly includes a printed-circuit-board, an integrated-circuit-die, a ball-grid-array, a barrier-material, and an adhesive-material. The printed-circuit-board includes a mounting-surface that defines a plurality of contact-pads and a continuous-trace that interconnects a selected-group of the contact-pads. The integrated-circuit-die includes an electrical-circuit having a plurality of solder-pads. The ball-grid-array includes a plurality of solder-balls interposed between the contact-pads and the solder-pads. The plurality of solder-balls establish electrical communication between the electrical-circuit and the contact-pads. The barrier-material is located between a string of solder-balls that are attached to the selected-group of the contact-pads to create a barrier. The barrier segregates an underfill-region from a non-underfill-region between the printed-circuit-board and the integrated-circuit-die. The barrier is in direct-contact with the string of the solder-balls, the integrated-circuit-die, and the continuous-trace. The adhesive-material is in direct contact with a portion of the underfill-region and the barrier prevents the adhesive-material from encroaching upon the non-underfill-region.

19 Claims, 4 Drawing Sheets

(51) Int. Cl.
*H01L 29/40* (2006.01)
*H01L 23/00* (2006.01)
*H01L 23/498* (2006.01)
*H01L 23/31* (2006.01)
*H01L 23/66* (2006.01)

(52) U.S. Cl.
CPC .............. *H01L 2224/73204* (2013.01); *H01L 2224/81815* (2013.01); *H01L 2924/0665* (2013.01); *H01L 2924/10161* (2013.01); *H01L 2924/1423* (2013.01)

(56) References Cited

U.S. PATENT DOCUMENTS

| | | | |
|---|---|---|---|
| 2008/0179738 A1 | 7/2008 | Nishimura et al. | |
| 2011/0095421 A1* | 4/2011 | Kim .................. | H01L 21/563 257/737 |
| 2011/0260338 A1* | 10/2011 | Lee .................. | H01L 21/563 257/778 |
| 2013/0147065 A1* | 6/2013 | Lee .................. | H01L 21/563 257/778 |

* cited by examiner

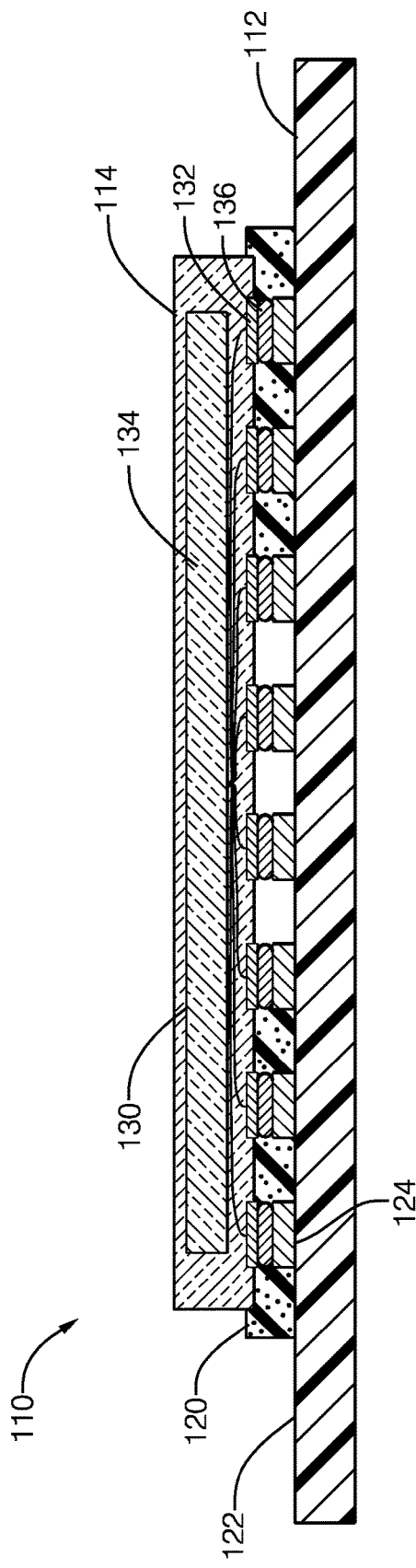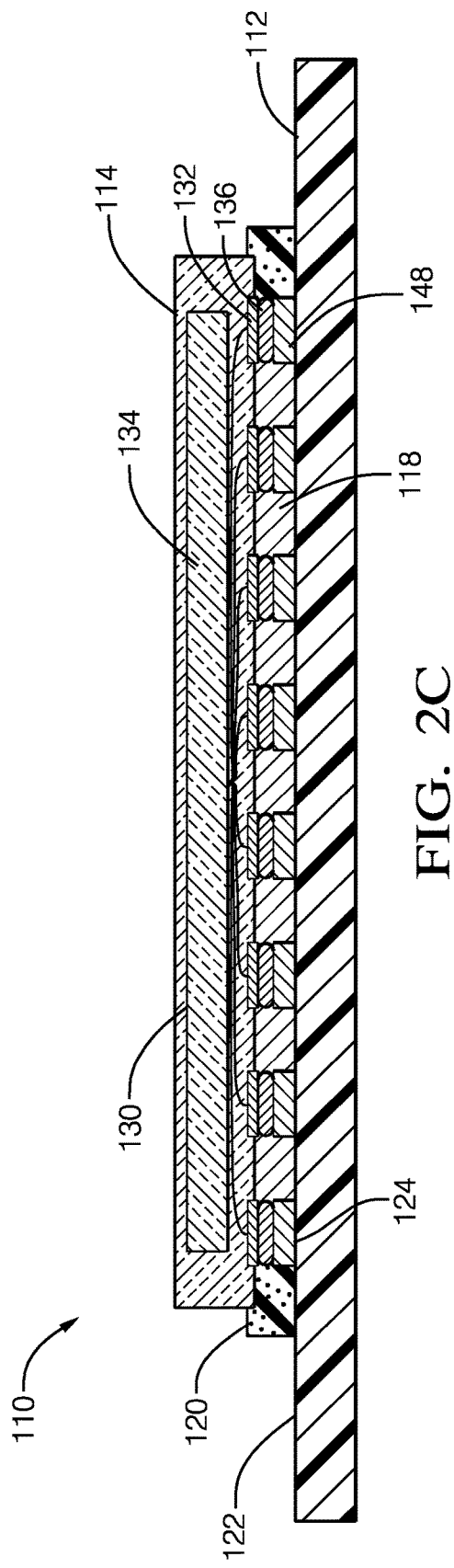

ELECTRICAL-DEVICE ADHESIVE BARRIER

TECHNICAL FIELD OF INVENTION

This disclosure generally relates to a circuit-board-assembly, and more particularly relates to a circuit-board-assembly that contains an integrated-circuit attached with a ball-grid-array and an adhesive.

BACKGROUND OF INVENTION

It is known to reinforce the mounting of an integrated-circuit to a printed-circuit-board with an underfill material. The underfill material may spread to regions of the printed-circuit-board that may not benefit from its presence.

SUMMARY OF THE INVENTION

In accordance with one embodiment, a circuit-board-assembly is provided. The circuit-board-assembly includes a printed-circuit-board, an integrated-circuit-die, a ball-grid-array, a barrier-material, and an adhesive-material. The printed-circuit-board includes a mounting-surface that defines a plurality of contact-pads and a continuous-trace that interconnects a selected-group of the contact-pads. The integrated-circuit-die includes an electrical-circuit having a plurality of solder-pads. The ball-grid-array includes a plurality of solder-balls interposed between the contact-pads and the solder-pads. The plurality of solder-balls establish electrical communication between the electrical-circuit and the contact-pads when the circuit-board-assembly is assembled. The barrier-material is located between a string of solder-balls that are attached to the selected-group of the contact-pads to create a barrier. The barrier segregates an underfill-region from a non-underfill-region between the printed-circuit-board and the integrated-circuit-die. The barrier is in direct-contact with the string of the solder-balls, the integrated-circuit-die, and the continuous-trace. The adhesive-material is in direct contact with a portion of the underfill-region and the barrier prevents the adhesive-material from encroaching upon the non-underfill-region.

In another embodiment, a circuit-board-assembly is provided. The circuit-board-assembly includes a printed-circuit-board, an integrated-circuit-die, a ball-grid-array, a barrier-material, and an adhesive-material. The printed-circuit-board includes a mounting-surface that defines a plurality of contact-pads and further defines a selected-group of the contact-pads. The integrated-circuit-die includes an electrical-circuit having a plurality of solder-pads. The ball-grid-array includes a plurality of solder-balls interposed between the contact-pads and the solder-pads. The plurality of solder-balls establish electrical communication between the electrical-circuit and the contact-pads when the circuit-board-assembly is assembled. The barrier-material is located between a string of solder-balls that are attached to the selected-group of the contact-pads to create a barrier. The barrier segregates an underfill-region from a non-underfill-region between the printed-circuit-board and the integrated-circuit-die. The barrier is in direct-contact with the string of the solder-balls, the integrated-circuit-die, and the printed-circuit-board. The adhesive-material is in direct contact with a portion of the underfill-region and the barrier prevents the adhesive-material from encroaching upon the non-underfill-region.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example with reference to the accompanying drawings, in which:

FIG. 2B is a cross section view along section C-C of the circuit-board-assembly of FIG. 2A in accordance with one embodiment; and FIG. 2C is a cross section view along section D-D of the circuit-board-assembly of FIG. 2A in accordance with one embodiment;

The reference numbers of similar elements in the embodiments shown in the various figures share the last two digits.

DETAILED DESCRIPTION

Figure 1A:
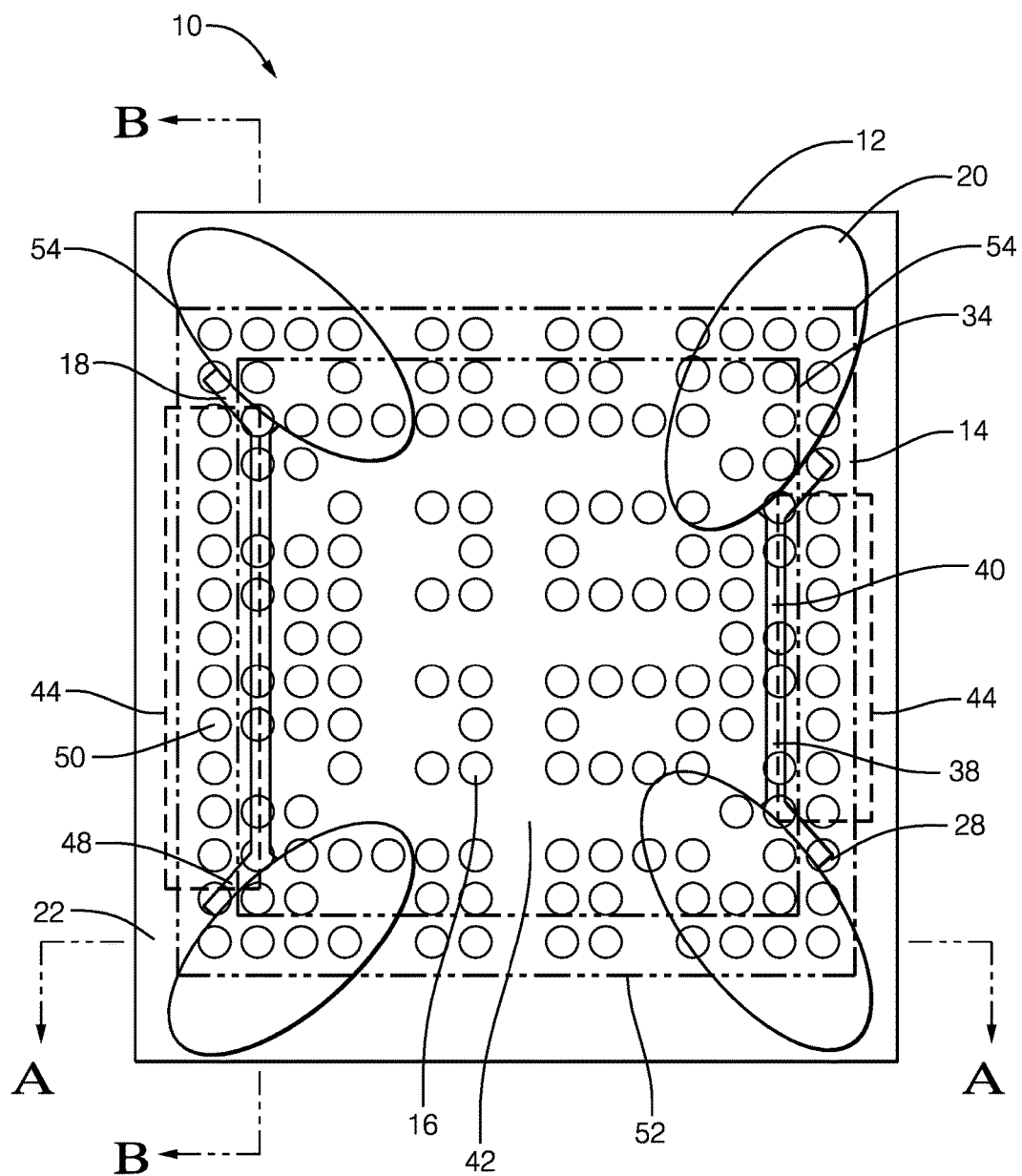
FIG. 1A is a top view of a circuit-board-assembly in accordance with one embodiment.
Figure 1B:
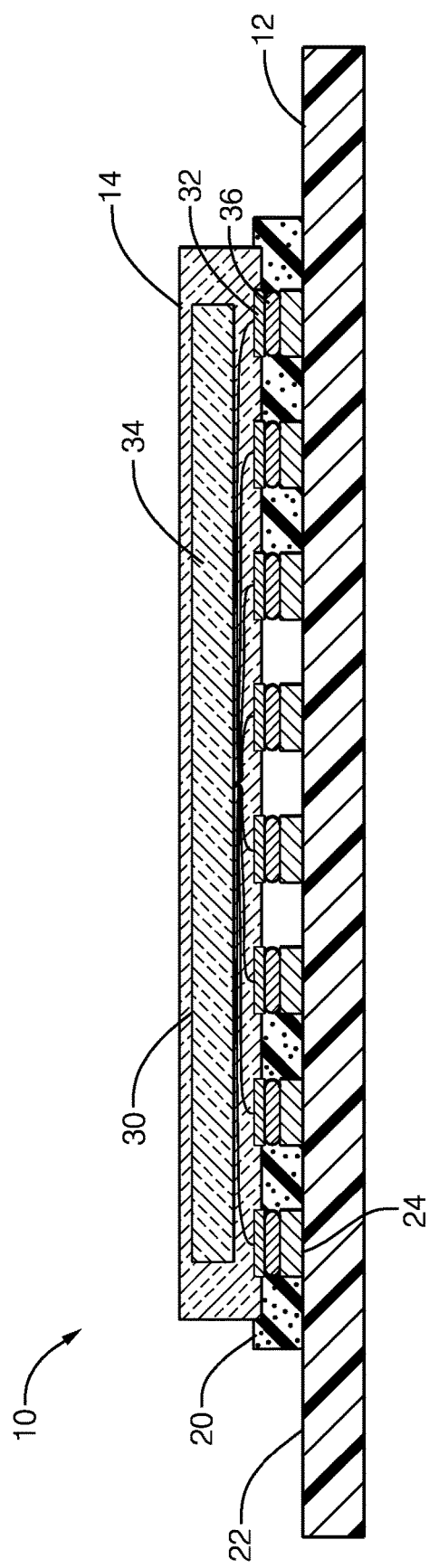
FIG. 1B is a cross section view along section A-A of the circuit-board-assembly of FIG. 1A in accordance with one embodiment.
Figure 1C:
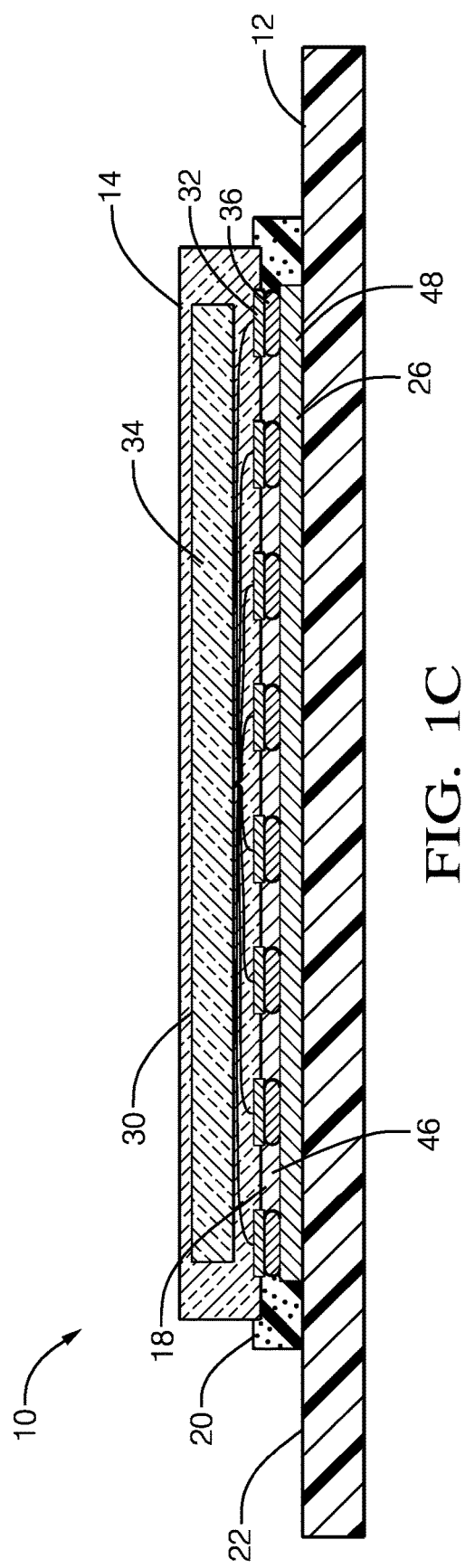
FIG. 1C is a cross section view along section B-B of the circuit-board-assembly of FIG. 1A in accordance with one embodiment.

FIGS. 1A-1C illustrate a non-limiting example of one embodiment of circuit-board-assembly 10 that includes a printed-circuit-board 12 (hereafter referred to as the PCB 12), an integrated-circuit-die 14 (hereafter referred to as the IC-die 14), a ball-grid-array 16 (hereafter referred to as the BGA 16), a barrier-material 18, and an adhesive-material 20.

The PCB 12 may be formed of circuit board substrates that are made of epoxy-resins or polyimide-resins. The resin may be reinforced with a woven glass cloth or other matrix such as chopped fibers. Substrates formed of such materials are typically referred to as FR-4 or G-10 type circuit boards. The circuit board substrate may alternatively be constructed of ceramic or rigid polymer materials. This listing of acceptable substrate materials is not exhaustive and other materials may also be used successfully. The PCB 12 may also include various electronic-components (not shown) including, but not limited to, capacitors, resistors, inductors, amplifiers, micro-processors, etc. as will be recognized by one skilled in the art. The PCB 12 includes a mounting-surface 22 that defines a plurality of contact-pads 24 and defines a continuous-trace 26 that interconnects a selected-group 28 of the contact-pads 24. The contact-pads 24 and the continuous-trace 26 may be formed by chemically etching a continuous-layer of conductive material, such as a copper-based material, that may be deposited on the circuit board substrate.

The IC-die 14 includes an electrical-circuit 30 that has a plurality of solder-pads 32. The solder-pads 32 may provide an electrical path through the IC-die 14, as will be recognized by those in the art. The electrical-circuit 30 may be any electrical-circuit 30, including, but not limited to, a monolithic-microwave-integrated-circuit 34 (MMIC 34) as illustrated in FIGS. 1A-1C.

The BGA 16 includes a plurality of solder-balls 36 interposed between the contact-pads 24 and the solder-pads 32. The plurality of solder-balls 36 may establish electrical communication between the electrical-circuit 30 and the contact-pads 24 when the circuit-board-assembly 10 is assembled. The typical assembly process may include placing the PCB 12 and the IC-die 14 in an oven heated to a melting temperature of the solder-balls 36 (typically 250° C.) where the solder melts and re-flows creating a metallurgical bond between the IC-die 14 and the contact-pads 24 upon cooling to a temperature below the melting temperature of the solder.

The barrier-material 18 may be located between a string 38 of solder-balls 36 that are attached to the selected-group 28 of the contact-pads 24 to create a barrier 40. The barrier 40 may segregate an underfill-region 42 from a non-underfill-region 44 between the PCB 12 and the IC-die 14, whereby the barrier 40 is in direct-contact with the string 38 of the solder-balls 36, the IC-die 14, and the continuous-trace 26.

The adhesive-material 20 may be in direct contact with a portion of the underfill-region 42, whereby the barrier 40 may prevent the adhesive-material 20 from encroaching upon the non-underfill-region 44. The typical adhesive-material 20 may be applied at room temperature after the circuit-board-assembly 10 is assembled (i.e. after the solder reflow process) as described above, and may flow around solder-joints between the IC-die 14 and the PCB 12 until cured. The adhesive-material 20 may also be cured at an elevated temperature according to the manufacturer's guidelines. The adhesive-material 20 (also referred to as "underfill", "corner bond", "edge bond", etc.) is designed to improve reliability of the circuit-board-assembly 10, specifically improving the fatigue strength of the solder-joints during thermal cycling. The adhesive-material 20 may also improve reliability during bending and mechanical shock. Many commercial adhesive-material 20 products exist, and those skilled in the art may select a particular product that meets the requirements for their particular application. One such adhesive-material 20 is G5602 manufactured by Stickl Material, Inc. of Pleasanton, Calif., USA. The adhesive-material 20 may preferably be an epoxy suitable for use with electrical components, such as LOCTITE® ECCOBOND E 1216M, manufactured by Henkel AG & Company, of Dusseldorf, Germany.

The barrier-material 18 may be a conductive-solder 46, such as ALPHA® OM-340 supplied by Cookson Electronics of South Plainfield, N.J., USA. The string 38 of solder-balls 36 may be metallurgically bonded to the solder-pads 32 and the continuous-trace 26, and the conductive-solder 46 may be metallurgically bonded to the solder-balls 36 and the continuous-trace 26.

In the non-limiting example illustrated by FIGS. 1A-1C, the IC-die 14 contains the MMIC 34 and the barrier 40 may provide a ground-path 48 for the electrical-circuit 30. The non-underfill-region 44 may contain solder-balls 36 that may propagate radio-frequency-signals 50 between the PCB 12 and the IC-die 14. The barrier 40 may advantageously prevent the adhesive-material 20 from contacting the solder-balls 36 that may propagate the radio-frequency-signals 50. This is advantageous because it may eliminate any detrimental impact on both an electrical performance of the MMIC 34, and on an impedance of the conductive traces of the PCB 12, that may result from a dielectric property of the adhesive-material 20.

The barrier-material 18 may also be an epoxy that may be compatible with the solder reflow process, such as LOCTITE®3508™ manufactured by Henkel AG & Company, of Dusseldorf, Germany. The barrier-material 18 may also be an electrically-conductive epoxy that is compatible with the solder reflow process, such as ABLEBOND® 967-1™ manufactured by Henkel AG & Company, of Dusseldorf, Germany. The barrier-material 18 may also be applied to the IC-die 14 and/or to the PCB 12 prior to the mounting of the IC-die 14.

FIGS. 1A-1C illustrate the IC-die 14 that is rectangular 52 and the adhesive-material 20 is located beneath corners 54 of the IC-die 14. This application location is advantageous because the solder-joints located near the corners 54 typically have a greater incidence of mechanical failure, compared to the solder-joints at other locations.

Figure 2A:
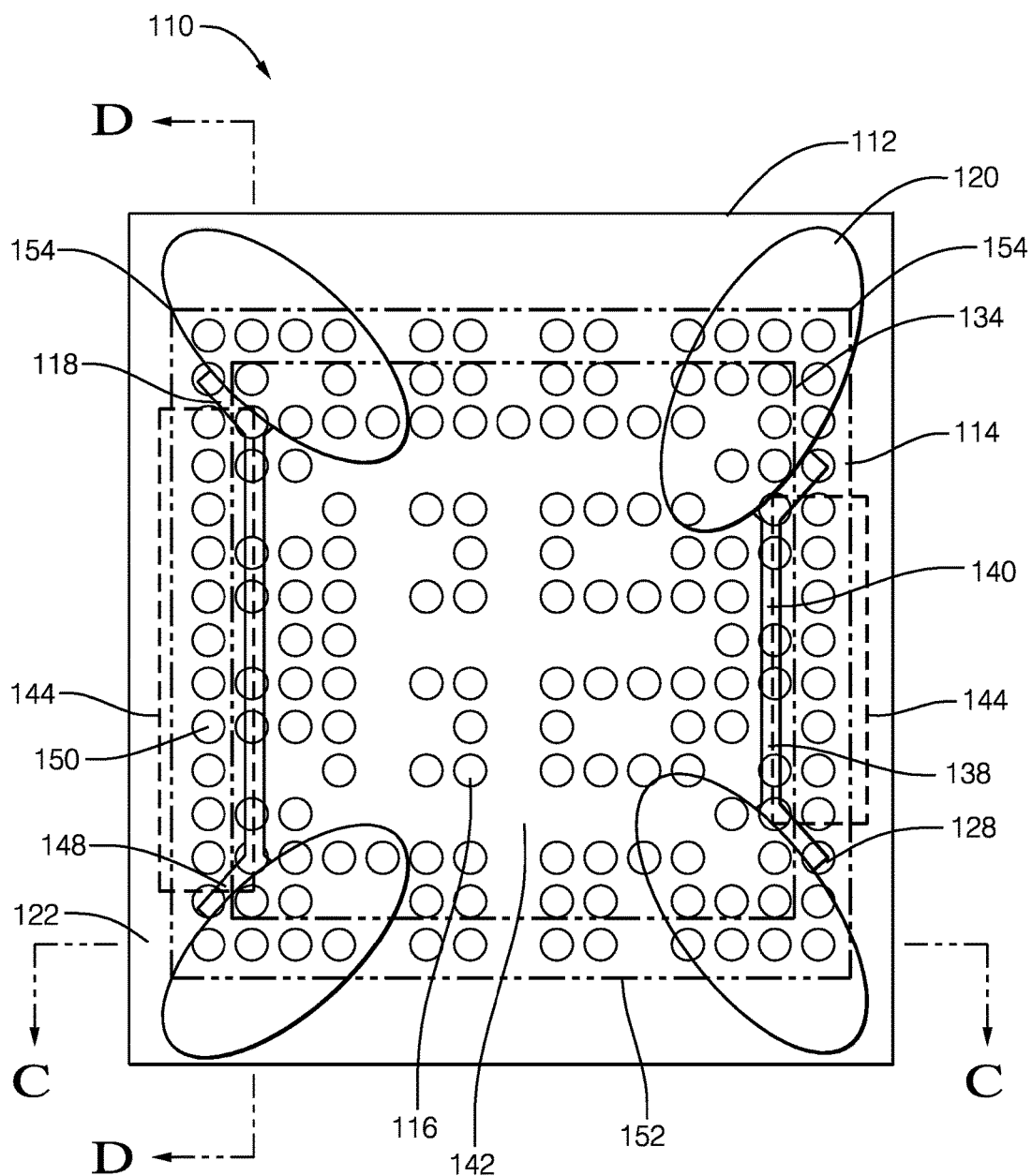
FIG. 2A is a top view of a circuit-board-assembly in accordance with another embodiment.

FIGS. 2A-2C illustrate a non-limiting example of another embodiment of a circuit-board-assembly 110 that includes a printed-circuit-board 112 (hereafter referred to as the PCB 112), an integrated-circuit-die 114 (hereafter referred to as the IC-die 114), a ball-grid-array 116 (hereafter referred to as the BGA 116), a barrier-material 118, and an adhesive-material 120.

The PCB 112 includes a mounting-surface 122 that defines a plurality of contact-pads 124 and further defines a selected-group 128 of the contact-pads 124. The contact-pads 124 may be formed by chemically etching a continuous layer of conductive material, such as a copper-based material, that is deposited on the circuit board substrate.

The IC-die 114 includes an electrical-circuit 130 that has a plurality of solder-pads 132. The solder-pads 132 may provide an electrical path through the IC-die 114, as will be recognized by those in the art. The electrical-circuit 130 may be any electrical-circuit 130, including, but not limited to, a monolithic-microwave-integrated-circuit 134 (MMIC 134) as illustrated in FIGS. 2A-2C.

The BGA 116 includes a plurality of solder-balls 136 interposed between the contact-pads 124 and the solder-pads 132. The plurality of solder-balls 136 may establish electrical communication between the electrical-circuit 130 and the contact-pads 124 when the circuit-board-assembly 110 is assembled. The typical assembly process may include placing the PCB 112 and the IC-die 114 in an oven heated to a melting temperature of the solder-balls 136 (typically 250° C.) where the solder melts and re-flows creating a metallurgical bond between the IC-die 114 and the contact-pads 124 upon cooling to a temperature below the melting temperature of the solder.

The barrier-material 118 may be located between a string 138 of solder-balls 136 that are attached to the selected-group 128 of the contact-pads 124 to create a barrier 140. The barrier 140 may segregate an underfill-region 142 from a non-underfill-region 144 between the PCB 112 and the IC-die 114, whereby the barrier 140 is in direct-contact with the string 138 of the solder-balls 136, the IC-die 114, and the PCB 112.

The adhesive-material 120 may be in direct contact with a portion of the underfill-region 142, whereby the barrier 140 may prevent the adhesive-material 120 from encroaching upon the non-underfill-region 144. The typical adhesive-material 120 may be applied at room temperature after the circuit-board-assembly 110 is assembled (i.e. after the solder reflow process) as described above, and may flow around solder-joints between the IC-die 114 and the PCB 112 until cured. The adhesive-material 120 may also be cured at an elevated temperature according to the manufacturer's guidelines. The adhesive-material 120 (also referred to as "underfill", "corner bond", "edge bond", etc.) is designed to improve reliability of the circuit-board-assembly 110, specifically improving the fatigue strength of the solder-joints during thermal cycling. The adhesive-material 120 may also improve reliability during bending and mechanical shock. Many commercial adhesive-material 120 products exist, and those skilled in the art may select a particular product that meets the requirements for their particular application. One such adhesive-material 120 is G5602 manufactured by Stickl Material, Inc. of Pleasanton, Calif., USA. The adhesive-material 120 may preferably be an epoxy suitable for use with electrical components, such as LOCTITE® ECCOBOND E 1216M, manufactured by Henkel AG & Company, of Dusseldorf, Germany.

In the non-limiting example illustrated by FIGS. 2A-2C, the IC-die 114 contains the MMIC 134 and the barrier 140 may provide a ground-path 148 for the electrical-circuit 130. The non-underfill-region 144 may contain solder-balls 136 that may propagate radio-frequency-signals 150 between the PCB 112 and the IC-die 114. The barrier 140 may advantageously prevent the adhesive-material 120 from contacting the solder-balls 136 that may propagate the radio-frequency-signals 150. This is advantageous because it may eliminate any detrimental impact on both an electrical performance of the MMIC 134, and on an impedance of the conductive traces of the PCB 112, that may result from a dielectric property of the adhesive-material 120.

The barrier-material 118 may be an epoxy that may be compatible with the solder reflow process, such as LOCTITE®3508™ manufactured by Henkel AG & Company, of Dusseldorf, Germany. The barrier-material 118 may also be an electrically-conductive epoxy that is compatible with the solder reflow process, such as ABLEBOND®967-1™ manufactured by Henkel AG & Company, of Dusseldorf, Germany. The barrier-material 118 may also be applied to the IC-die 114 and/or to the PCB 112 prior to the mounting of the IC-die 114.

FIGS. 2A-2C illustrate the IC-die 114 that is rectangular 152 and the adhesive-material 120 is located beneath corners 154 of the IC-die 114. This application location is advantageous because the solder-joints located near the corners 154 typically have a greater incidence of mechanical failure, compared to the solder-joints at other locations.

Accordingly, a circuit-board-assembly 10 is provided. The circuit-board-assembly 10 includes the barrier 40 that advantageously prevents the adhesive-material 20 from encroaching upon the non-underfill-region 44. This is advantageous because it eliminates any detrimental impact on both the electrical performance of the electrical-circuit 30, and on the impedance of the conductive traces of the PCB 12, that may result from the dielectric property of the adhesive-material 20.

While this invention has been described in terms of the preferred embodiments thereof, it is not intended to be so limited, but rather only to the extent set forth in the claims that follow. Moreover, the use of the terms first, second, etc. does not denote any order of importance, but rather the terms first, second, etc. are used to distinguish one element from another. Furthermore, the use of the terms a, an, etc. do not denote a limitation of quantity, but rather denote the presence of at least one of the referenced items. Additionally, directional terms such as upper, lower, etc. do not denote any particular orientation, but rather the terms upper, lower, etc. are used to distinguish one element from another and locational establish a relationship between the various elements.

We claim:

1. A circuit-board-assembly, comprising:
    a printed-circuit-board that includes a mounting-surface that defines a plurality of contact-pads and a continuous-trace that interconnects a selected-group of the contact-pads;
    an integrated-circuit-die that includes an electrical-circuit, said integrated-circuit-die having a plurality of solder-pads;
    a ball-grid-array that includes a plurality of solder-balls interposed between the contact-pads and the solder-pads, said plurality of solder-balls establish electrical communication between the electrical-circuit and the contact-pads when the circuit-board-assembly is assembled,
    a barrier-material located between a string of solder-balls that are attached to the selected-group of the contact-pads to create a barrier that segregates an underfill-region from a non-underfill-region between the printed-circuit-board and the integrated-circuit-die, whereby the barrier is in direct-contact with the string of the solder-balls, the integrated-circuit-die, and the continuous-trace; and
    an adhesive-material in direct contact with a portion of the underfill-region, whereby the barrier prevents the adhesive-material from encroaching upon the non-underfill-region.

2. The circuit-board-assembly in accordance with claim 1, wherein the barrier-material is a conductive-solder.

3. The circuit-board-assembly in accordance with claim 2, wherein the string of solder-balls are metallurgically bonded to the solder-pads and the continuous-trace, and wherein the conductive-solder is metallurgically bonded to the solder-balls and the continuous-trace.

4. The circuit-board-assembly in accordance with claim 3, wherein the barrier provides a ground-path for the electrical-circuit.

5. The circuit-board-assembly in accordance with claim 3, wherein the electrical-circuit is a monolithic-microwave-integrated-circuit.

6. The circuit-board-assembly in accordance with claim 5, wherein the non-underfill-region contains solder-balls that propagate radio-frequency-signals between the printed-circuit-board and the integrated-circuit-die.

7. The circuit-board-assembly in accordance with claim 1, wherein the barrier-material is an epoxy.

8. The circuit-board-assembly in accordance with claim 7, wherein the epoxy is electrically-conductive.

9. The circuit-board-assembly in accordance with claim 1, wherein the adhesive-material is an epoxy.

10. The circuit-board-assembly in accordance with claim 1, wherein the integrated-circuit-die is rectangular and the adhesive-material is located beneath corners of the integrated-circuit-die.

11. A circuit-board-assembly, comprising:
    a printed-circuit-board that includes a mounting-surface that defines a plurality of contact-pads and further defines a selected-group of the contact-pads;
    an integrated-circuit-die that includes an electrical-circuit, said integrated-circuit-die having a plurality of solder-pads;
    a ball-grid-array that includes a plurality of solder-balls interposed between the contact-pads and the solder-pads, said plurality of solder-balls establish electrical communication between the electrical-circuit and the contact-pads when the circuit-board-assembly is assembled,
    a barrier-material located between a string of solder-balls that are attached to the selected-group of the contact-pads to create a barrier that segregates an underfill-region from a non-underfill-region between the printed-circuit-board and the integrated-circuit-die, whereby the barrier is in direct-contact with the string of the solder-balls, the integrated-circuit-die, and the printed-circuit-board; and an adhesive-material in direct contact with a portion of the underfill-region, whereby the barrier prevents the adhesive-material from encroaching upon the non-underfill-region.

12. The circuit-board-assembly in accordance with claim 11, wherein the solder-balls are metallurgically bonded to the solder-pads and the contact-pads.

13. The circuit-board-assembly in accordance with claim 12, wherein the plurality of the solder-balls included in the barrier provides a ground-path for the electrical-circuit.

14. The circuit-board-assembly in accordance with claim 12, wherein the electrical-circuit is a monolithic-microwave-integrated-circuit.

15. The circuit-board-assembly in accordance with claim 14, wherein the non-underfill-region contains solder-balls that propagate radio-frequency-signals between the printed-circuit-board and the integrated-circuit-die.

16. The circuit-board-assembly in accordance with claim 11, wherein the barrier-material is an epoxy.

17. The circuit-board-assembly in accordance with claim 16, wherein the epoxy is electrically-conductive.

18. The circuit-board-assembly in accordance with claim 11, wherein the adhesive-material is an epoxy.

19. The circuit-board-assembly in accordance with claim 11, wherein the integrated-circuit-die is rectangular and the adhesive-material is located beneath corners of the integrated-circuit-die.

* * * * *